(12) United States Patent
Finkler et al.

(10) Patent No.: US 8,723,514 B2
(45) Date of Patent: May 13, 2014

(54) MAGNETIC FIELD SENSOR DEVICE FOR DIRECT MAGNETIC FIELD IMAGING AND METHOD OF FABRICATION THEREOF

(75) Inventors: Amit Finkler, Rehovot (IL); Jens Martin, Rehovot (IL); Yuri Myasoedov, Rehovot (IL); Yehonathan Segev, Rehovot (IL); Amir Yacoby, Rehovot (IL); Eli Zeldov, Rehovot (IL)

(73) Assignee: Yeda Research and Development Company Ltd., Rehovot (IL)

( * ) Notice: Subject to any disclaimer, the term of this patent is extended or adjusted under 35 U.S.C. 154(b) by 984 days.

(21) Appl. No.: 12/667,642

(22) PCT Filed: Jun. 26, 2008

(86) PCT No.: PCT/IL2008/000876
§ 371 (c)(1),
(2), (4) Date: Jan. 4, 2010

(87) PCT Pub. No.: WO2009/004609
PCT Pub. Date: Jan. 8, 2009

(65) Prior Publication Data
US 2010/0207622 A1    Aug. 19, 2010

Related U.S. Application Data

(60) Provisional application No. 60/948,025, filed on Jul. 5, 2007.

(51) Int. Cl.
*G01R 33/02*    (2006.01)
(52) U.S. Cl.
USPC .......................................... 324/248; 505/846

(58) Field of Classification Search
USPC ............................................................ 324/248
See application file for complete search history.

(56) References Cited

U.S. PATENT DOCUMENTS

| | | | |
|---|---|---|---|
| 4,971,947 A | 11/1990 | Barnes et al. | |
| 6,211,673 B1 | 4/2001 | Gerber et al. | |
| 6,847,546 B2 * | 1/2005 | Hirata et al. | 365/162 |
| 2005/0057248 A1 | 3/2005 | Woods et al. | |
| 2007/0194225 A1 | 8/2007 | Zorn | |

FOREIGN PATENT DOCUMENTS

| | | |
|---|---|---|
| EP | 0 699 921 A2 | 3/1996 |
| EP | 0 869 372 A2 | 10/1998 |
| EP | 1 202 052 A2 | 5/2002 |
| WO | WO 97/29385 A1 | 8/1997 |
| WO | WO 2004/021017 A2 | 3/2004 |

OTHER PUBLICATIONS

J.R. Kirtley, "SQUID microscopy for fundamental studies," *Physica C*, Mar. 1, 2002, vol. 368, No. 1-4, pp. 55-65.

(Continued)

*Primary Examiner* — Reena Aurora
(74) *Attorney, Agent, or Firm* — Oliff PLC

(57) ABSTRACT

The present invention discloses a novel magnetic sensor device performing direct magnetic field imaging, comprising a probe having a conical tip portion which is configured as a sensor having two superconductors separated by a thin non-superconducting layer (such as a Josephson junction based sensor), where the non-superconducting layer is located at the apex portion of said conical tip, thereby defining electron tunneling region(s) at said apex portion. The technique of the present invention enables the sensor device to be very small and to be brought very close to the sample surface.

20 Claims, 9 Drawing Sheets

(56) References Cited

OTHER PUBLICATIONS

E. D. Dahlberg et al., "Magnetic microscopies: the new additions," *Journal of Magnetism and Magnetic Materials*, Oct. 1, 1999, vol. 200, No. 1-3, pp. 720-728.
V. V. Moshchalkov et al., "Nucleation of superconductivity and vortex matter in hybrid superconductor/ferromagnet nanostructures," *Comptes Rendus Physique*, Jan. 1, 2006, vol. 7, No. 1, pp. 86-98.
D. Koelle et al., "High-transition-temperature superconducting quantum interference devices," *Reviews of Modern Physics*, Apr. 1999, vol. 71, No. 3, pp. 631-686.
K. K. Likharev, "Superconducting weak links," *Reviews of Modern Physics*, Jan. 1979, vol. 51, No. 1, pp. 101-159.
K. Hasselbach et al., "MicroSQUID magnetometry and magnetic imaging," *Physica C*, May 1, 2000, vol. 332, No. 1-4, pp. 140-147.
K. Kadowaki et al., "Vortex states in high-$T_c$ superconductors and superconductivity in modern nano-science and engineering," *Science and Technology of Advanced Materials*, Sep. 1, 2005, vol. 6, No. 6, pp. 589-603.
D.J. Van Harlingen et al., "Extending SQUID interferometry beyond the cuprates and beyond d-wave symmetry," *Physica C*, May 1, 1999, vol. 317-318, pp. 410-420.
B. L. T. Plourde et al., "Vortex dynamics in thin superconducting strips observed by Scanning SQUID Microscopy," *Physica C*, Nov. 1, 2000, vol. 341-348, pp. 1023-1026.
D. P. Norton, "Synthesis and properties of epitaxial electronic oxide thin-film materials," *Materials Science and Engineering R*, Mar. 15, 2004, vol. 43, No. 5-6, pp. 139-247.
X. N. Xie et al., "Nanoscale materials patterning and engineering by atomic force microscopy nanolithography," *Materials Science and Engineering R*, Dec. 14, 2006, vol. 54, No. 1-2, pp. 1-48.
I. Guillamon et al., "Scanning tunneling spectroscopy with superconducting tips of A1," *Physica C*, Apr. 1, 2008, vol. 468, No, 7-10, pp. 537-542.
J. R. Kirtley et al., "Scanning Squid Microscopy," *Annual Review of Materials Science*, 1999, vol. 29, pp. 117-148.
K. Harada et al., "Real-time observation of vortex lattices in a superconductor by electron microscopy," *Nature*, Nov. 5, 1992,vol. 360, No. 51-53.
J. R. Kirtley et al., "Symmetry of the order parameter in the high-$T_c$ superconductor $YBa_2Cu_3O_{7-\delta}$," *Nature*, Jan. 19, 1995, vol. 373, No. 225-228.
A. Yacoby et al., "Electrical imaging of the quantum Hall state," *Solid State Communications*, 1999, vol. 111, pp. 1-13.
S. A. Wolf et al., "Epitaxial growth of superconducting niobium thin films by ultrahigh vacuum evaporation," *Journal of Vacuum Science and Technology*, May 1986, vol. 4.
Y. Paltiel et al., "Dynamic instabilities and memory effects in vortex matter," *Nature*, Jan. 27, 2000, vol. 403, pp. 398-401.
N. Avraham et al., "Local measurements of magnetization in $Mn_{12}$ crystals," *Physical Review B*, 2005, vol. 72, pp. 144428-1-144428-6.
Y. Suzuki et al., "Propagation of Avalanches in $Mn_{12}$-Acetate: Magnetic Deflagration," *Physical Review Letters*, 2005, vol. 95, pp. 147201-1-147201-4.
International Search Report issued in Application No. PCT/IL2008/000876; dated Jan. 5, 2009.
Koshnick et al., "A terraced scanning superconducting quantum interference device susceptometer with submicron pickup loops", Dec. 15, 2008, Applied Physics Letters 93.
Wang, Zhao-Sheng, "Superconducting Properties of Iron-Based Ba-122 by Transport Measurements and Scanning Nano-Squid Microscopy", May 26, 2012, Universite de Grenoble.

* cited by examiner

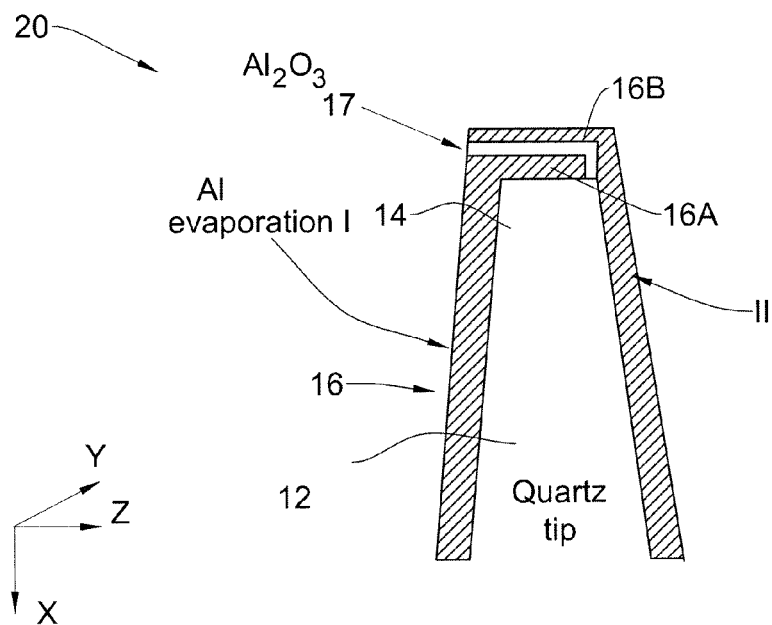
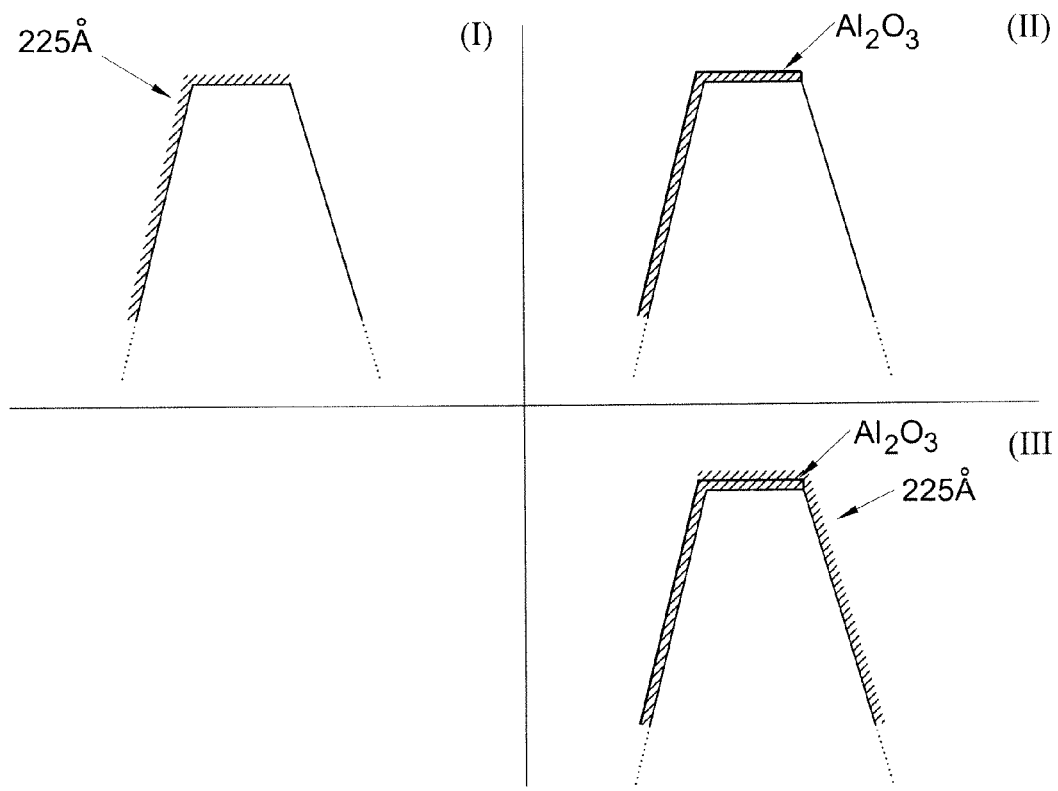
Fig.3
Fig.4

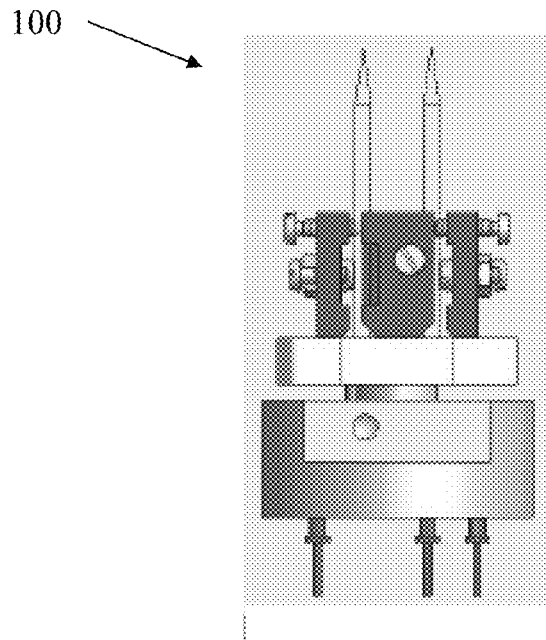
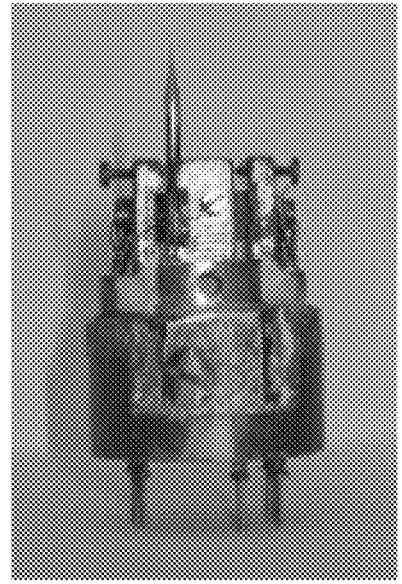
Fig. 11A  Fig. 11B
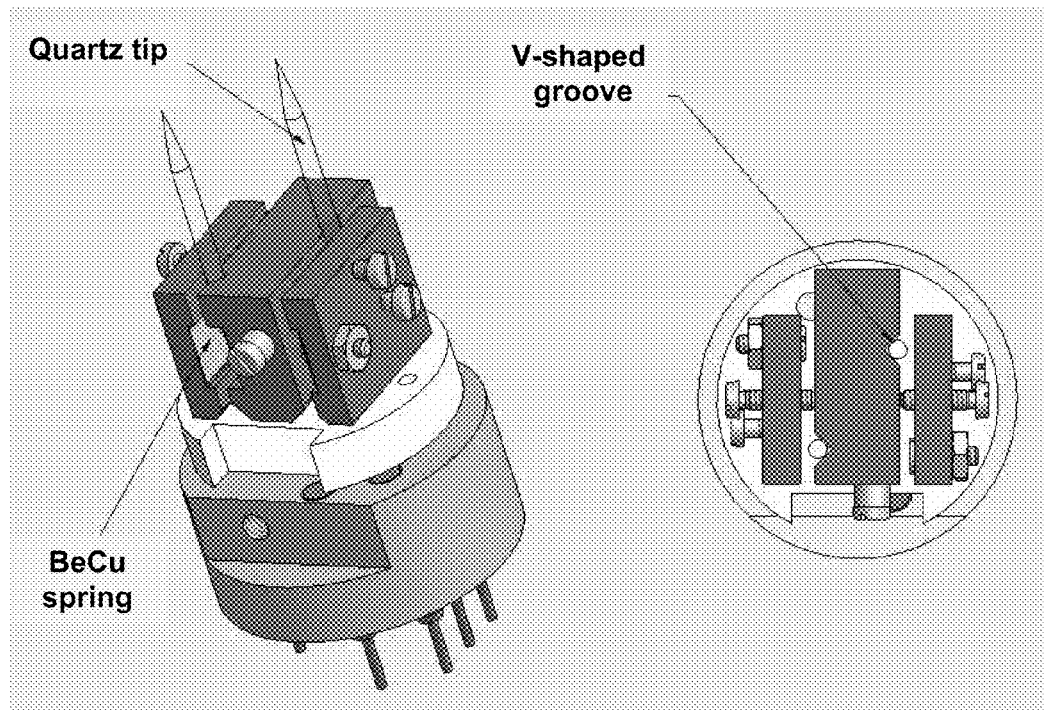
Fig. 12

|  | Planar | Tip |
|---|---|---|
| Technology | Nb/Al$_2$O$_3$/Nb | Pure Al or Nb with weak links |
| Size | > 1μm × 1μm | < 1μm × 1μm |
| Sensitivity | 10$^{-6}$ Φ$_0$/$\sqrt{Hz}$ | At least 10$^{-4}$ Φ$_0$/$\sqrt{Hz}$ |
| Ease of Fabrication | Long clean room process | 3 hour process |
| Locality | Fabricated on a large substrate | A local probe per-definition |
| Operating temperature | Typically 4K | <1K for Al tips, 4K for Nb tips |

Fig. 14

MAGNETIC FIELD SENSOR DEVICE FOR DIRECT MAGNETIC FIELD IMAGING AND METHOD OF FABRICATION THEREOF

The present application is a U.S. National Stage of PCT/IL2008/000876, filed on Jun. 26, 2008. PCT/IL2008/000876 claims the benefit of U.S. Provisional Application No. 60/948,025, filed Jul. 5, 2007.

FIELD OF THE INVENTION

This invention relates to local magnetic field sensor devices for direct magnetic field imaging and method of fabrication thereof.

REFERENCES

The following references are considered to be pertinent for the purpose of understanding the background of the present invention:

1. K. Harada, T. Matsuda, J. Bonevich, M. Igarashi, S. Kondo, G. Pozzi, U. Kawabe, and A. Tonomura, Nature 360, 51 (1992).
2. H. J. Hug, A. Moser, I. Parashikov, B. Stiefel, O. Fritz, H.-J. Güntherodt, and H. Thomas, Physica C 235-240, 2695 (1994).
3. J. R. Kirtley, C. C. Tsuei, J. Z. Sun, C. C. Chi, Lock See Yu-Jahnes, A. Gupta, M. Rupp, and M. B. Ketchen, Nature 373, 225 (1995).
4. B. L. T. Plourde and D. 3. V. Harlingen, Review of Scientific Instruments 70, 4344 (1999).
5. Likharev, K. K. Superconducting weak links. Rev. Mod. Phys. 51, 101, (1979).
6. A. Yacoby, H. F. Hess, T. A. Fulton, L. N. Pfeiffer and K. W. West, Solid State Communications 111, 1 (1999).
7. Wolf, S. A., Qadri, S. B., Claassen, J. H., Francavilla, T. L., and Dalrymple, B. J. Epitaxial growth of superconducting niobium thin films by ultrahigh vacuum evaporation. Journal of Vacuum Science & Technology A: Vacuum, Surfaces, and Films 4, 524 (1986).
8. T. Giamarchi and S. Bhattacharya, High Magnetic Fields: Applications in Condensed Matter Physics, Spectroscopy (Springer, 2002), p. 314.
9. Y. Paltiel, E. Zeldov, Y. N. Myasoedov, H. Shtrikman, S. Bhattacharya, M. J. Higgins, Z. L. Xiao, E. Y. Andrei, P. L. Gammel, and D. J. Bishop, Nature 403, 398 (2000).
10. N. Avraham, A. Stern, Y. Suzuki, K. M. Mertes, M. P. Sarachik, E. Zeldov, Y. Myasoedov, H. Shtrikman, E. M. Rumberger, D. N. Hendrickson, N. E. Chakov, and G. Christou, Physical Review B 72, 144428 (2005).
11. Y. Suzuki, M. P. Sarachik, E. M. Chudnovsky, S. McHugh, R. Gonzalez-Rubio, N. Avraham, Y. Myasoedov, E. Zeldov, H. Shtrikman, N. E. Chakov, and G. Christou, Physical Review Letters 95, 147201 (2005).
12. W. A. Little, Rev. Sci. Instrum. 55, 661 (1984).
13. D. Koelle, R. Kleiner, F. Ludwig, E. Dantsker and J. Clarke, Rev. Mod. Phys. 71, 631 (1999).

BACKGROUND OF THE INVENTION

Within the rapidly developing field of nanoscale science and technology, nanomagnetism is of major scientific interest. Nanomagnets promise to be of key technological importance with applications ranging from electronics, including hard discs, magnetic RAM, Giant Magneto Resistance (GMR) devices, and spin valves, through magnetic fluids for industrial uses, and up to biotechnology applications including enhanced imaging of tissues and organs, virus-detecting MRI, and cancer therapy.

Besides NMR, common local magnetic imaging methods include scanning Hall probes, scanning Superconducting Quantum Interference Devices (SQUIDs), Magnetic Force Microscopy (MFM), Lorentz microscopy, Bitter decoration, and magneto-optical imaging. Lorentz microscopy [1] and MFM [2] have a high spatial resolution (10 to 100 nm), however their field sensitivity is relatively low (of the order of 10 Gauss). Scanning SQUID microscopy [3] has the highest field sensitivity (1 µG), but it has a rather poor spatial resolution (of several microns).

A scanning SQUID microscope having high spatial resolution typically uses a magnetic sensor such as a SQUID and a fiber probe magnetically coupled between the SQUID sensor and the sample under study. The fiber probe has a sharply defined tip, and the SQUID has a two-dimensional planar geometry, in which the SQUID loop is fabricated on a flat substrate, and then mounted on the microscope's end. This technique is disclosed for example in US 2005/0057248.

In an alternative technique [4], a Josephson junction is mounted on a conventional tip of a STM (Scanning Tunneling Microscope). The STM is used to maintain a constant distance between the sample and the junction measuring the magnetic field.

In this connection, it should be noted that the Josephson junction is an arrangement of two superconductors with a thin insulating barrier in between, in which a superconducting current flows between the superconductors crossing the barrier even when a zero voltage bias is applied onto them. This barrier can be generalized to some weak link [5], being a normal metal proximity layer, an insulating oxide barrier or some geometrical constriction between the two superconductors.

In a single Josephson junction, the time evolution of the phase difference between wavefunctions (Ginzburg-Landau) of the two superconducting electrodes, $\Delta\phi$, is given by $$\frac{d\Delta\varphi}{dt} = \frac{2e}{\hbar}V,$$

where V is the voltage drop across the junction.

Introducing the gauge-invariant phase difference, $$\gamma = \Delta\varphi - \frac{2\pi}{\Phi_0}\int A \cdot ds$$

the superconducting current ("supercurrent") in an ideal Josephson junction is $$I_S = I_C \sin\gamma,$$

where $$\Phi_0 = \frac{hc}{e^*}$$

and $I_c$ is the critical current, above which superconductivity is lost i.e. the maximal supercurrent that the junction can carry and where e*=2e.

In a double Josephson junction device, (two Josephson junctions connected in parallel), also known as SQUID, the supercurrents passing through the two junctions in a contour are summed, taking into account the difference in phases between the two electrodes, the flux through a loop is $$\Phi = \oint A \cdot ds = \frac{\Phi_0}{2\pi} \int_{electrodes} \Delta\varphi \cdot ds + \int_{junctions} A \cdot ds$$

Since $\phi$ must be single-valued, the sum of the gauge-invariant phase differences (from 1 to 2 plus from 2 to 1, both going clockwise) is $2\mu\Phi/\Phi_0$. If the super-currents passing through the two junctions go from one electrode to the other, their difference must satisfy the following condition:

$$\gamma_1 - \gamma_2 = \frac{2\pi\Phi}{\Phi_0} (\text{mod } 2\pi).$$

Therefore, the maximum supercurrent is flux-dependent and is given by:

$$I_{max} = 2I_C \left|\cos\left(\frac{\pi\Phi}{\Phi_0}\right)\right|; I_c = I_{c1} + I_{c2}$$

This result can be used to calculate the magnetic flux through a loop by measuring the critical current, which results in resolving the magnetic flux in the SQUID to very accurate values (as accurate as $10^{-6}\Phi_0$).

General Description

There is a need in the art in providing a magnetic sensor device performing direct magnetic field imaging, having a high spatial resolution. The effective spatial resolution of magnetic sensors is determined not only by the size of the sensors but also by their proximity to the sample. As previously discussed, the existing SQUID technology based sensor devices have size limitations, and the alignment and the scanning of a SQUID sensor, located nanometers above the sample surface, is limited.

The present invention solves the above problem by providing a novel sensor device comprising a probe having a conical tip portion which is configured as a sensor having two superconductors separated by a thin non-superconducting layer (such as a Josephson junction based sensor), where the non-superconducting layer is located at the apex portion of said conical tip, thereby defining electron tunneling region(s) at said apex portion. The technique of the present invention enables the sensor device to be very small and to be brought very close to the sample surface.

It should be noted that a tuning-fork feedback mechanism can be used to approach the surface of a sample. In the tuning fork feedback, or shear force feedback, the tip is mounted to a tuning fork, which is then excited at its resonant frequency. The amplitude of this oscillation is strongly dependent on the tip-surface distance, and it can be effectively used as a feedback signal. This technique involves gluing the probe to a tuning fork and measuring the decrease in the tuning fork's resonant amplitude as it gets closer and closer to the surface of a sample.

The size of the sensor device of the present invention is determined by the size of the pulled tip rather than by the lithographic processing, and the tip can be scanned in extremely close proximity to the sample surface using STM or other SPM (Scanning probe microscope) feedback mechanisms. In addition, such a tip-like sensor device provides for obtaining large bandwidth and reduced noise at higher fields, due to reduced flux trapping in the narrow superconducting leads.

In the present invention, a single or a double Josephson junction based sensor is fabricated on the edge (apex) of a submicron conical tip. The advantage of using a tip as a probe, instead of a planar substrate, is to minimize the distance between the sensor and the sample, and to approach the surface of the sample more accurately.

According to another broad aspect of the present invention, there is provided a local magnetic field sensor device for direct magnetic field imaging, comprising a probe having a conical tip portion which is configured as a sensor having two superconductors separated by a thin non-superconducting layer, such that electrons can cross through the insulating barrier, where at least said insulating barrier (i.e. a tunneling region) of the sensor is located at the apex portion of said conical tip.

The Josephson junction based sensor may be configured for determining the field orientation. The conical tip portion may have a maximal outer diameter that does not exceed a few hundreds of nanometers. The conical tip portion may have a maximal outer diameter of about 100 nm-500 nm. The tunneling region may have a lateral dimension of a few nanometers to several tens of nanometers. The tunneling region may have a lateral dimension of about 10 nm.

In some embodiments, the tip portion, configured as the Josephson junction based sensor, has a core made from an electrical insulator and a superconducting film coating on a selected circumferential region of said insulator core, forming a weak link defining the tunneling region at the apex of said tip. The tip portion configured as the Josephson junction based sensor has a core made from quartz material. The Josephson junction based sensor comprises a continuous superconducting film coating on a selected circumferential region of said quartz core, forming a weak link at the apex of said tip. The superconducting film is selected from aluminum niobium, lead, indium, and tin.

The Josephson junction based sensor is configured and operable to enable a sensitivity of less than 1 Gauss/$\sqrt{Hz}$, a spatial resolution of less than 100 nm, and a large bandwidth of at least ten kHz.

In some embodiments, the Josephson junction based sensor comprises a SQUID (Superconducting Quantum Interference Device) loop, extending along a circumferential region of the conical tip portion, such that the tunneling regions are located at the apex of said tip. It should be noted that a SQUID consists of a superconducting ring biased with a current I. An external magnetic field $H=B/\mu$ is applied to the loop, where $\mu$ is the permeability of the material. A Josephson junction is incorporated into each of the two arms of the DC SQUID. The Josephson junctions limit the maximum super-current $I_c$ that can flow across the ring to a maximum value given by the sum of the critical currents of the two junctions. The magnetic flux enclosed inside the SQUID ring modulates periodically, with a period of one flux quantum $\Phi_0 = h/2e$. This modulation, caused by an interference of the superconducting wave functions in the two SQUID arms, forms the basis of the working principle of the DC SQUID. In this case, the sensor is configured and operable to enable a sensitivity of about 50 mGauss/$\sqrt{Hz}$ and a sensitivity of about $1.75 \cdot 10^{-4} \Phi_0/\sqrt{Hz}$ at a temperature of 300 mK.

The sensor may comprise a single electron transistor (SET) probe, thereby enabling simultaneous nanoscale imaging of magnetic field and electrical potentials having a sensitivity of $\mu V$.

According to yet another broad aspect of the present invention, there is provided a method of fabricating a Josephson junction based sensor device. The method comprises providing a conically shaped tip-like substrate made of an electrically insulating material, and coating at least a selected circumferential region of said insulator substrate with a superconducting film so as to form a weak link defining a tunneling region at the apex of said tip.

According to yet a further broad aspect of the invention, there is provided a method of fabricating a Josephson junction based sensor device. The method comprises providing a conically shaped tip-like substrate made of an electrically insulating material, coating at least a selected circumferential region of said insulator substrate with a superconducting film so as to define two film portions spaced-apart from one another at the apex of said tip; and providing an insulator spacer between said two film portions, thereby defining at least one tunneling region at the apex of said tip. The method also comprises insulating a selected region within the tip apex, and then coating the remaining part of the conical tip circumference and the upper insulator with a superconducting film. The selected region is insulated within the tip apex by oxidation of said selected region. The evaporation of the continuous superconducting film may be performed at least at two angles of evaporation. Two films may be evaporated on two opposite sides of a pulled quartz tube.

The two Josephson junctions may be formed to make a circular SQUID loop. The method comprises pulling a tube to define two constriction-based weak links in the cross section of said tube.

In some embodiments, a single electron transistor (SET) probe may be incorporated into said tip. The method comprises coating the circumference of the insulating conical tip with a metallic or a superconducting film patterned to define the two tunneling regions connected in series one to another; coating said tip with an insulating film; and forming a Josephson junction based sensor device above said insulating film selected from a single Josephson junction and a SQUID loop. The method further comprises coating said superconducting layer with Au or Pd—Au so as to protect said tip and make it usable for STM approach in which tunneling current is identified between the end of said tip and a sample.

The critical current of a Josephson junction (JJ) is sensitive to a magnetic field, such that its critical current oscillates as a function of a magnetic field in a way analogous to intensity of light on a screen in a single-slit diffraction experiment, which oscillates as a function of displacement.

According to some embodiments of the invention, the conical tip-like sensor device is configured as a single Josephson junction (i.e. single tunneling region) with either planar or vertical field sensitivity. The vertical field sensitivity can be obtained by coating the tip-like electrically insulating cone with a superconducting continuous film, where the Josephson junction is created as a superconductor-insulator-superconductor tunnel junction at the edge (apex) of the tip. The planar field sensitivity can be obtained by coating a part of the insulating tip-cone circumference with a superconducting layer, then providing upper insulator thereon within the tip apex, e.g. by oxidation, and then coating the remaining part of the tip-cone circumference and the upper insulator with a superconducting film.

According to some other embodiments of the invention, the conical tip-like sensor device is configured as a SQUID (two Josephson junctions connected in parallel). This can be implemented by pulling a tube rather than a rod as in the case of a single Josephson junction. The cross section of the tube naturally forms two weak links.

According to another embodiment of the present invention, the tips can incorporate a single electron transistor (SET) probe [6] thus allowing unprecedented simultaneous nanoscale imaging of magnetic fields with mG sensitivity and electrical potentials with $\mu V$ sensitivity. The SET device is incorporated into the tip by a two or more layer process. The SET may be deposited as a first layer. The junctions for the single-electron transistor can be made with electron-beam lithography and a standard self-aligned double-angle deposition process. Then, the tip is coated with an insulating layer and the SQUID is deposited as a third layer.

One of the advantages of this approach is that it allows sensitivity to the out-of-plane component of the magnetic field, as well as a comparison between the local magnetic and electrochemical information obtained with the SQUID and SET probes.

According to some other embodiments of the invention, the end of the tip may be cooled (e.g. to a temperature of 70K) by Joule-Thomson refrigeration [12]. Highly pressurized gas can cool the apex of the tip while passing through it, as it expands from high pressure to low pressure. This, of course, requires the SQUID, and possibly the entire tube, to be made from a high-temperature superconductor [13], having a critical temperature higher than the cooled temperature (e.g. 70K). By using this method of refrigeration, it is possible to locally cool only the very end of the tip, possibly enabling the use of the device outside of a liquid-helium/nitrogen Dewar, for use for example on living tissues for biological applications.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 3 schematically illustrates a cross section view of another configuration of a magnetic field sensor device, where the single Josephson tunnel junction is configured to have planar field sensitivity;

FIG. 4 schematically illustrates an example of a fabrication process of the single Josephson tunnel junction device of FIG. 3;

FIGS. 11A-11B schematically illustrate a tip holder operative as a substrate holder during evaporation and as a sample holder during low-temperature measurements in the liquid helium systems;

FIG. 12 illustrates different views of the tip holder of FIG. 11;

FIG. 14 is a table of comparison between the device of the present invention and commercially available SQUIDs; and, FIG. 15 illustrates a mechanism configured to cool the apex of the tip according to the teachings of the present invention.

DETAILED DESCRIPTION OF EMBODIMENTS

Figure 1:
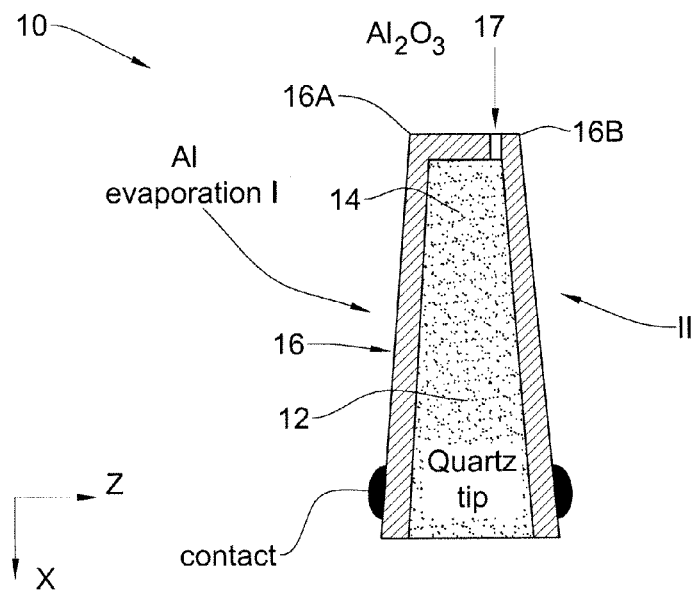
FIG. 1 schematically illustrates an example of a cross section view of a magnetic field sensor device of the present invention including a Josephson junction based sensor comprising a single tunnel junction with vertical field sensitivity.

Referring to FIG. 1, there is illustrated an example of a magnetic field sensor device, generally designated 10. The device is configured as a Josephson junction based sensor having a single tunnel junction, with vertical field sensitivity (in which the sensitivity of the sensor is parallel to the rod, represented in FIG. 1 to be in the X direction). The device 10 includes a conically shaped core 12 having an apex portion 14, thus defining a tip-like portion; and an electrodes arrangement defined by two separate (spaced-apart) portions 16A and 16B of a superconducting film 16 which is coated on at least a part of the conical core 12 including its apex 14. Within the apex 14, the film coating 16 is broken and is separated by an insulator 17 thus defining a tunneling region between the electrodes 16A and 16B. Hence, a single Josephson junction (JJ) with vertical field sensitivity is created, in which the junction is parallel to the magnetic field in the X direction.

The device 10 can be fabricated by any suitable technique (e.g. film deposition and etching). The device may utilize a quartz tip. Generally, the device can operate at liquid Helium ($^4$He and $^3$He) temperatures. Aluminum and Niobium, as well as other possible metals, can be used as superconductors to fabricate such a device. Quartz (fused $SiO_2$) rods and tubes with an outer diameter of 1 mm can be used. For the tubes, their inner diameter may be 0.5 mm. The rods/tubes can for example be purchased from Sutter Instruments (Heraeus HSQ300).

In order to pull quartz Sutter Instruments, a $CO_2$ laser-based micropipette puller can be used. The probes can be made of quartz rods pulled to a conical shape tip, which are then evaporated with aluminum. Rods can be fabricated with diameters smaller than 100 nm at the apex. Compared to other glasses, quartz has the lowest dielectric constant, the highest volume resistivity, a high melting point and a small thermal expansion coefficient.

The tips can be placed in a designated rotator flange, which enables rotation of the tip with respect to the evaporation source. Zero-angle alignment may be done using a small laser diode placed next to the rotating frame. The inventors have fabricated several experimental devices each in a different process, where the main differences are the angle of evaporation and whether or not in-situ oxidation was used in the process. The tip's resistance was measured during the process using in-vacuum wiring going from the tip-holder to the electrical feedthrough.

It should be noted, although not specifically shown, that the tunneling region (17 in FIG. 1) can be formed by covering the insulator cone 12 which has a a sharp edge (apex) 14 (e.g. quartz tip) with a continuous superconducting film. This will form a weak link at the apex resulting in a critical current that is field-dependent. In a non-limiting example, an evaporation of 200 Å of aluminum at an angle of 100° with respect to the rod direction (X direction) is firstly performed, followed by an evaporation of 200 Å of aluminum at an angle of −100° with respect to the X direction, and by an evaporation of 200 Å of aluminum at an angle of 0° with respect to the X direction. These tips are simple to make and involve no specific process of creation of an additional insulator within the tunneling region (no oxidation).

Figure 2:
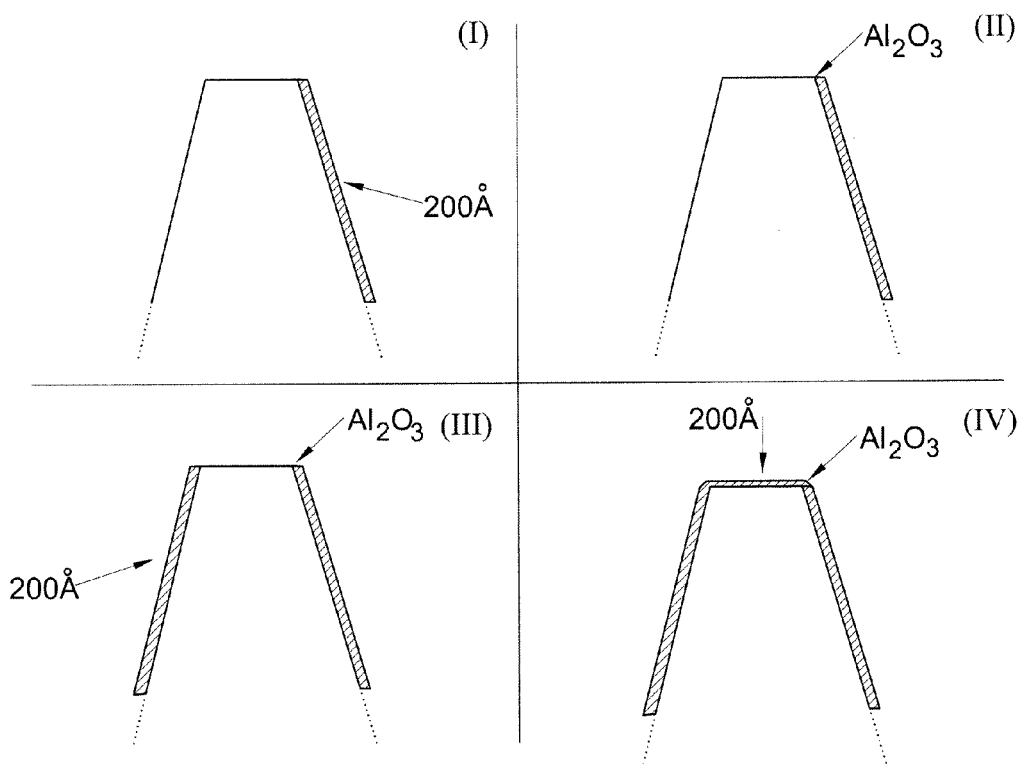
FIG. 2 illustrates an example of a fabrication process of the single Josephson tunnel junction device of FIG. 1.

Reference is made to FIG. 2 exemplifying a process of fabrication of the device 10 shown in FIG. 1. In this example, two or more evaporation steps of aluminum at different angles, and oxidation of aluminum, are used to obtain various junction orientations.

A layer of 200 Å of aluminum is evaporated on a rod tip at an angle of 100° with respect to the X direction (step (I)). Then, oxidation with synthetic air is performed for 30 seconds at a pressure of 100 mTorr (step (II)). A second evaporation of 200 Å of aluminum is then performed at an angle of −100° with respect to the X direction (step (III)). Thereafter, a third evaporation of 200 Å of aluminum is performed at an angle of 0° with respect to the X direction (step (IV)).

As illustrated in FIGS. 3 and 4, the single Josephson junction device can be configured to achieve planar field sensitivity. To facilitate understanding, the same reference numbers are used for identifying common components in the examples of the invention. FIG. 3 shows a sensor device 20 including a conically shaped core 12 having an apex portion 14; and an electrodes arrangement 16A-16B defined by a superconducting film 16 coated on at least a part of the conical core 12 including its apex 14. Within the apex portion 14, the film parts 16A and 16B are spaced from each other along the cone axis α-axis) with an insulator 17 between them, thus defining a tunneling region. Hence, a single JJ having planar field sensitivity is obtained, namely the value of the critical current of the junction is sensitive to magnetic fields in Y and Z directions.

FIG. 4 exemplifies the fabrication process of the device 20. A layer of 225 Å of aluminum is evaporated on a rod tip at an angle of 55° with respect to the X direction (step (I)). Oxidation with synthetic air is then performed for 30 seconds at a pressure of 100 mTorr (step (II)). A second evaporation of 225 Å of aluminum is performed at an angle of −55° with respect to the X direction (step (III)). The procedure follows the I-III stages consecutively. The effective junction is an S-I-S one, sensitive to magnetic field perpendicular to the X direction.

Figure 5:
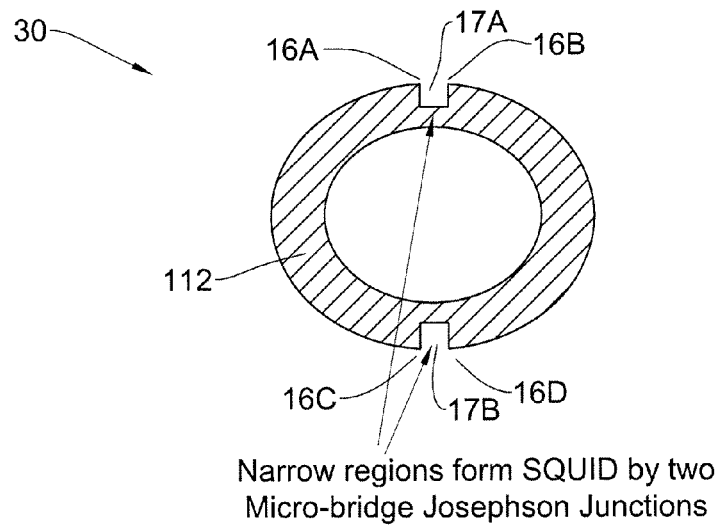
FIG. 5 schematically illustrates a top view of another configuration of a magnetic field sensor device including two weak links based sensor configured as a SQUID.
Figure 6:
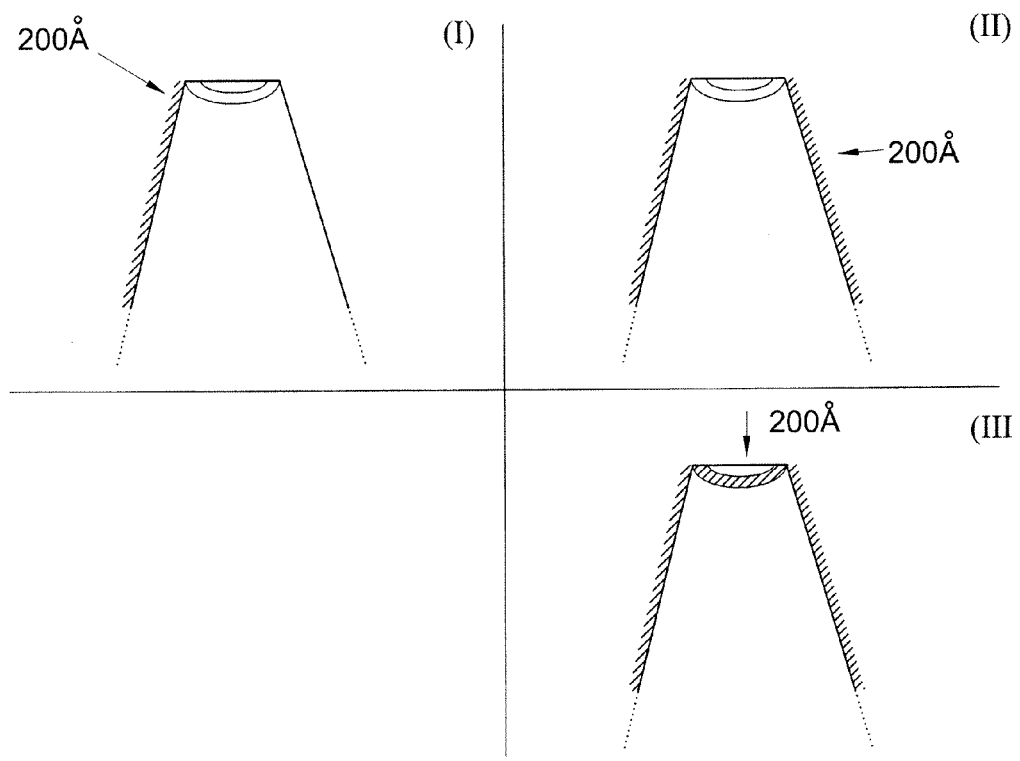
FIG. 6 schematically illustrates an example of a fabrication process of the SQUID of FIG. 5.

According to some other embodiments of the present invention, the sensor device includes a probe comprising two Josephson junctions (JJ) connected in parallel, also known as SQUID, By pulling a quartz tube, one can fabricate a circular SQUID loop on the tip of the tube comprising two JJs. One of the advantages of the present invention is that the pulling technique naturally forms a small ring of diameter of the order of 100 nm at the apex, onto which the SQUID loop can be evaporated in a self-aligned manner with no need for micro-fabrication methods. Reference is made to FIGS. 5 and 6 illustrating a SQUID based sensor device and its method of fabrication. The device 30 includes a conically shaped tube 112 having an apex portion 14, thus defining a tip-like portion; and an electrodes arrangement formed by a continuous closed loop superconducting film 16 (electrode) coated on at least a part of the conical core 112 including its apex 14, and patterned to form two spaced-apart slots 17A and 17B. This configuration of the film 16 defines two pairs of spaced-apart electrode regions 16A-16B and 16C-16D, spaced by insulator regions 17A and 17B, respectively, thus forming two JJs.

The device 30 can be fabricated as follows: a layer of 200 Å of aluminum is evaporated at an angle of 100° with respect to the X direction (step (I)). A second layer of 200 Å of aluminum is evaporated on the tube tip 112 at an angle of −100° with respect to the X direction (step (II)). A third layer of 200 Å of aluminum is evaporated at an angle of 0° with respect to the X direction (step (III)). Generally, the JJs can be formed by one of the following techniques: Al—Al$_2$O$_3$—Al process as for single JJ; by formation of two narrow constrictions along the loop using noncircular tubes; using nanomachining or FIB milling; or different angle evaporation as described above.

Figure 7:
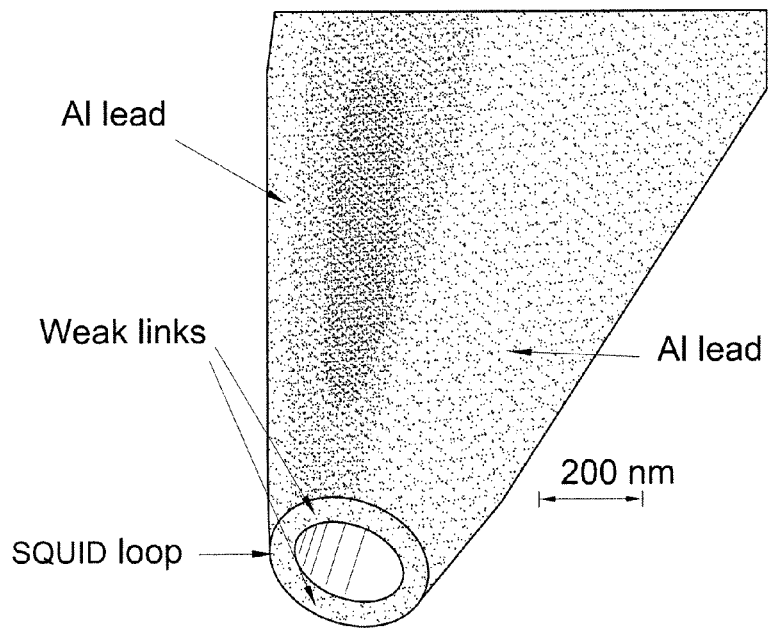
FIG. 7 is a SEM micrograph illustrating a magnified image of the end of a quartz tube tip evaporated with aluminum forming a SQUID.
Figure 8:
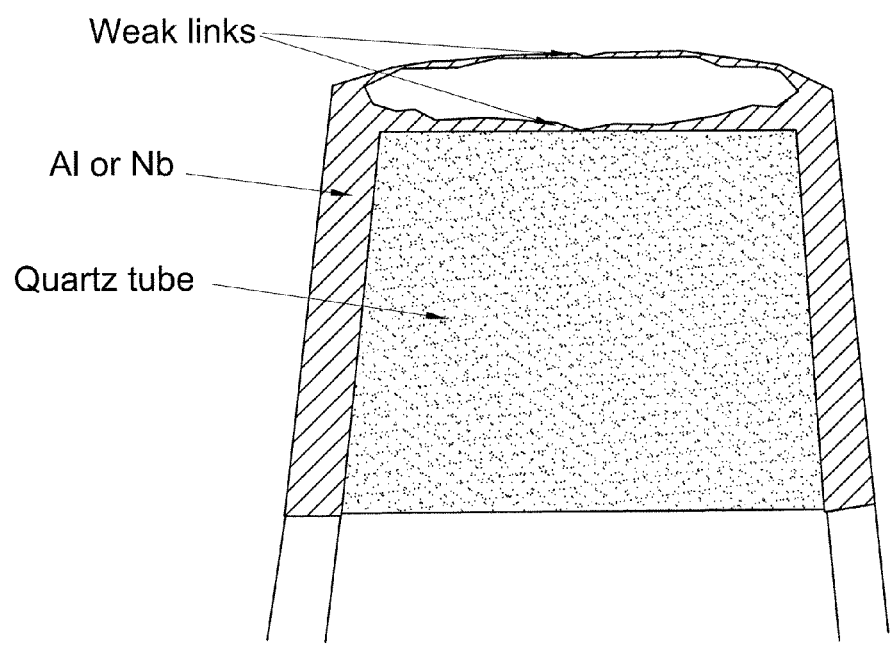
FIG. 8 schematically illustrates that the inherent geometry of the tip's end forms two weak links junctions.
Figure 9:
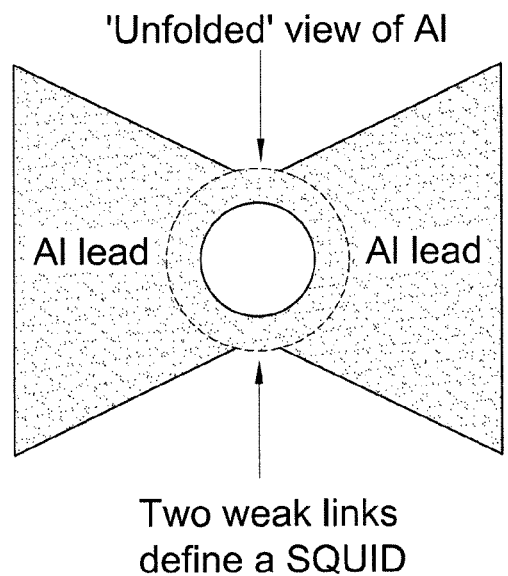
FIG. 9 schematically illustrates an unfolded top view of aluminum coating defining a SQUID on a tip.
Figure 10:
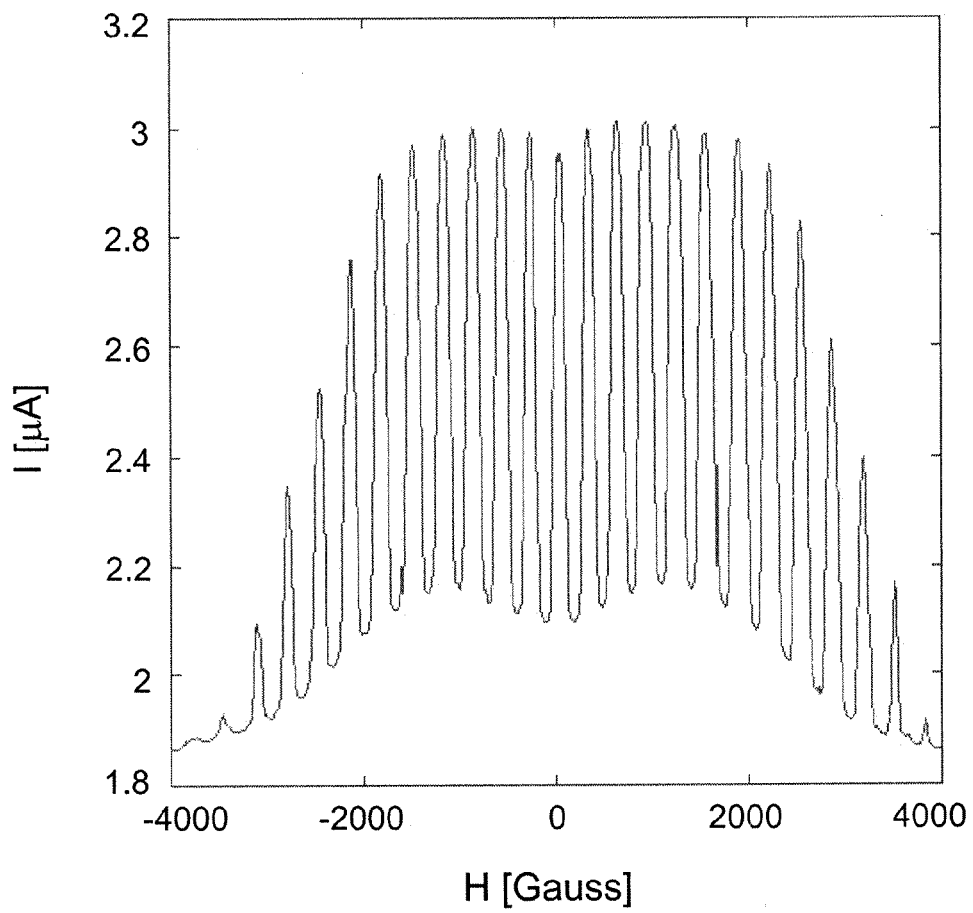
FIG. 10 schematically illustrates the measurements of quantum interference patterns of a 300 nm size SQUID.

FIG. 7 shows a SEM image of a tube-like tip configured as a SQUID after the aluminum film evaporation. FIG. 8 shows another example where the inherent geometry of the tip's apex by itself makes two weak links junctions. To illustrate the SQUID geometry in a different way, a SQUID viewed from the top in a stretched view is given in FIG. 9. The two large aluminum leads residing on the sides of the conical tube are seen on the left and right sides of the ring-shaped tip apex. The two narrow regions which are formed naturally, act as two weak links. For example, for a 300 nm outer diameter of the ring-shaped apex, the width of the weak-link regions is about 50 nm, determined by the thickness of the tube walls at the apex. The critical current of the SQUID shows large and clear quantum interference patterns in magnetic field, as shown in FIG. 10. This device showed field sensitivity of about 50 mG/√Hz.

It should be noted that aluminum can be replaced by niobium. The magnetic sensor device would then operate at higher temperatures (above 4.2 K). An e-gun evaporator can be used to get a thin superconducting niobium film on a quartz tip. The substrate has to be kept at a high temperature, i.e. from 400° C. to 800° C. during the evaporation [7].

The inventors have also developed a new tip holder configured for holding such conically shaped tip-like sensors. This holder is configured to serve as a substrate (quartz tip) holder during evaporation and as a sample holder during low-temperature measurements in the liquid helium systems. No direct wire-soldering to the tip is used. The contact to each side of the tip is made with a different electrode made out of brass or copper. An example of the holder 100, configured as a double-tip holder, is schematically illustrated in FIGS. 11A and 11B. In this example, as shown in FIG. 12, one electrode has a 1 mm deep V-shaped groove where the tip fits, so that one electrode of the tip touches the groove, while a Beryllium copper (BeCu) spring makes contact to the second electrode of the tip. Since in each pulling process, two tips are produced, a double-tip holder is designed. Copper wires are connected, either by soldering (for the aluminum tip holder) or by crimping (for the niobium tip holder), from the bottom pins to the holder electrodes. According to the teachings of the present invention, the tip's resistance can be measured during evaporation and afterwards at low-temperature measurements using the same tip holder.

All Josephson junction and SQUID measurements may be performed in voltage bias. For example, a voltage bias is applied on the tip using a standard Yokogawa 7651 DC source, and the current through it is amplified using an Ithaco 1211 current amplifier to a voltage which is read by an Agilent 34401A multimeter. AC measurements are performed in a similar way to the continuous tip, i.e. an AC-source (usually the oscillator of an SRS830 lock-in amplifier) is connected in series with the DC source, and the current is measured by the current measurement circuit of the lock-in amplifier. The differential conductance of the tip is then measured effectively.

Figure 13A:
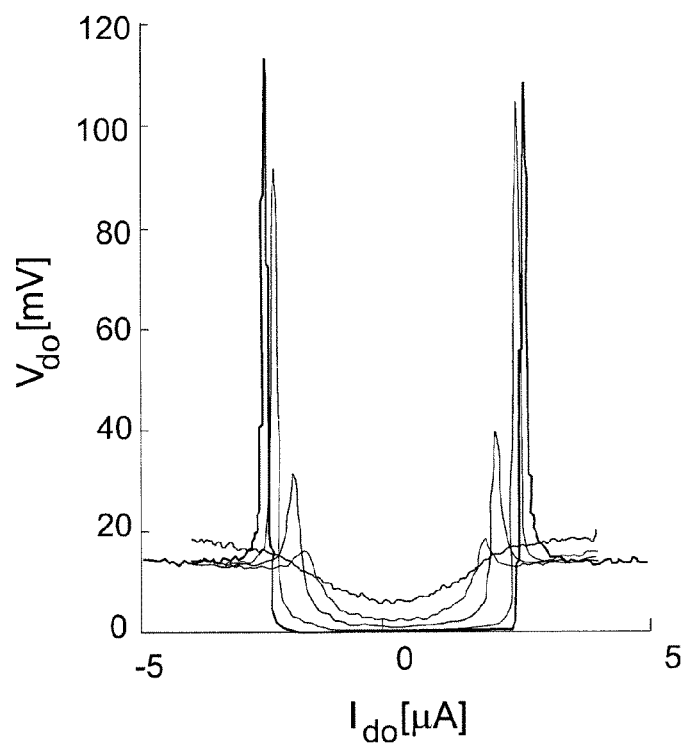
FIG. 13A schematically illustrates DC I-V measurement of a continuous thin aluminum film tip.
Figure 13B:
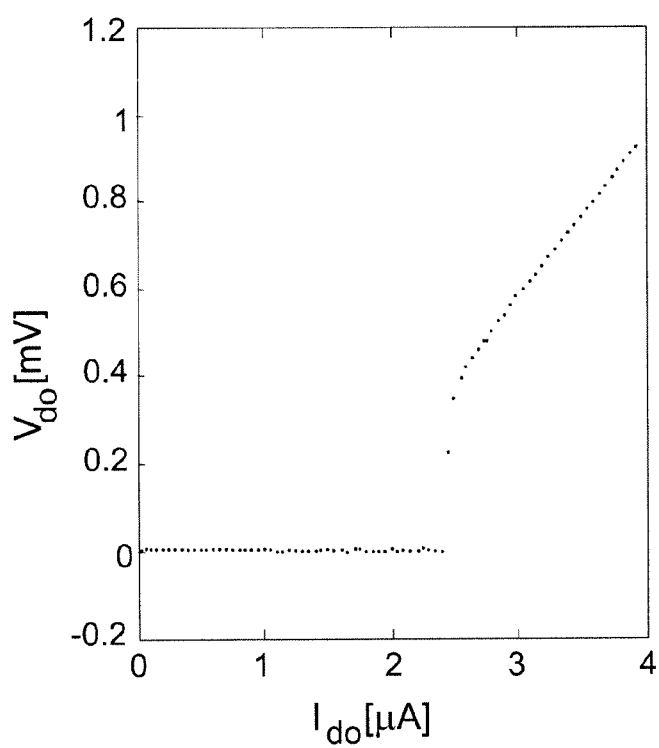
FIG. 13B schematically illustrates differential resistance measurements of a continuous thin aluminum film tip for different magnetic fields.

A continuous film of about 20 nm thick on a tip is firstly characterized. The superconducting phase transition gives an estimate of T$_c$, from which the energy gap can be calculated, $$\Delta(0) = \frac{\pi}{e^\gamma} k_B T_C,$$

with γ being the Euler number. The effective differential resistance of a tip with an outer diameter of 100 nm is measured. It should be noted that the "jump" in the DC measurement presented in FIG. 13A indicates that superconductivity is quenched. Each curve corresponds to different magnetic fields (0 Tesla, 0.2 Tesla, 0.3 Tesla, 0.4 Tesla and 0.8 Tesla) applied on the tip. At currents smaller than this critical current I$_c$, the tip is superconducting and its resistance is zero, while at currents larger than I$_c$, superconductivity is quenched and its resistance jumps to its normal state resistance Rn. AC measurements of the same tip exhibit a peak in the differential resistance in the region of the critical current. The AC current amplitude was 50 nA at a frequency of 10.5 Hz. The magnetic field makes the critical current decrease until the superconductivity is completely quenched in the tip, as observed in FIG. 13B. The largest slope of an AC measurement at the critical field was about 1 µN/Gauss (at a frequency of 10.5 Hz). DC measurements gave similar slopes. The best sensitivity achieved in this case is a few Gauss/√Hz.

The Josephson junction tips having a diameter of 100 nm are then characterized. These tips may be evaporated with the junction geometry as proposed in FIG. 3. The O$_2$ pressure is changed during oxidation to optimize its performance, i.e. increase its maximum supercurrent.

Small tunnel junction tips (having a diameter of 100 nm) exhibited only a zero order interference pattern, while the larger ones (having a diameter of 500 nm) showed an interference pattern for magnetic field dependence. The magnetic field dependence had a typical DC slope of ~500 pA/Gauss for the supercurrent in the large diameter tips, and several orders of magnitude less for the smaller diameter tips.

The SQUID tips using quartz tubes pulled to a small diameter are then characterized. The geometry of such hollow tips gives the needed conditions to fabricate a SQUID, e.g. evaporating the tip from above creating two Dayem bridges (weak-links) between the two superconducting leads.

Moreover, high-quality SQUIDs are hysteretic in nature [8], and in order to use them in a practical system, they are usually shunted. The evaporation process creates an intrinsic shunt in parallel with the SQUID. The tip has an outer diameter of 300 nm. The critical current's magnetic field dependence is measured using two methods. For SQUIDs with an intrinsic shunt, (i.e. in the non-hysteretic regime), the critical current can be measured at a constant voltage bias. For SQUIDs without this shunt, the entire current-voltage (I-V) curve has to be measured for each magnetic field, the critical current has to be identified and then plotted as a function of the magnetic field. The magnetic field sensitivity of the sensor is measured in the $^3$He system. These measurements are performed with an external shunt connected in parallel with the tip to inhibit hysteresis. Performing differential resistance (AC+DC) measurements using for example a lock-in amplifier enables to resolve 1 Gauss steps in applied field at frequencies as high as 5 kHz and greater.

Noise measurements at different frequencies up to 20 kHz yielded a noise figure of about 50 mG/√Hz.

It should be noted that the surface of a sample can be scanned, using the tip of the present invention, at a constant external magnetic field to observe vortices in superconductors. A tunneling current may be identified between the end of the tip and the sample, as typically performed using a conventional STM technique. However, a thin layer of alumina is created on the top-most layer of the aluminum film due to oxidation near the end of the tip. The inventors of the present invention have developed a method for scanning the surface of a sample using tunneling between the tip's end and the sample, using the tip fabricated according to some embodiments of the present invention. The method comprises coating the superconducting layer (e.g. aluminum film) with gold (Au) or palladium-gold (Pd—Au). Gold and also palladium do not oxidize, so that this additional layer makes tunneling more reliable. In addition, the inventors of the present invention have developed a method for scanning the surface of a sample by using the sensor device of the present invention and a tuning-fork feedback mechanism technique.

Also, in-situ preparation chamber of the SPM may be used to fabricate samples so that the aluminum cannot oxidize during and after evaporation.

The device and the method of the present invention can be used for investigation and imaging of nanomagnetic systems and local magnetic phenomena in numerous intriguing systems, such as equilibrium and dynamic properties of nanomagnets, including local magnetic order and phase transitions, spin-dependent transport and nanomagnet dynamics driven by spin-transfer torque of polarized currents, single flux dynamics in superconductors, quantum tunneling and avalanches in molecular magnets, magnetization effects in two dimensional conductors such as quantum Hall systems, magnetic structures in superconductor-insulator transitions, as well as current flow imaging in nanoscale electronic devices, nanotubes, and organic-molecule-based networks and devices.

For example, using the teachings of the present invention, vortex dynamics in superconductors on a single vortex level may be investigated. The high spatial resolution, high sensitivity, and the wide bandwidth of the invented method allow detailed investigation and direct imaging of the numerous theoretically predicted exciting dynamic phenomena and phase transformations of a flowing vortex system driven by applied current in presence of quenched disorder [8, 9]. Moreover, the local magnetic behavior, quantum tunneling, and the front propagation dynamics of magnetization avalanches in molecular magnets [10, 11] may also be investigated with a SQUID based device of the present invention.

The sensor device of the present invention can be also used for investigation of the physics of vortex matter in various superconductors. The sensor has the required specifications to locally probe the magnetic field of single vortices in high-$T_a$ superconductors. The required specifications are as follows: a small size of several hundred nanometers, because the distance between vortices in an applied magnetic field of 20 Gauss is 1 μm; a high sensitivity of less than 1 Gauss/√Hz. At a distance of a few tens of nanometers above the surface of a superconducting crystal, the modulation between the magnetic field in an isolated vortex and outside of it is about 100 Gauss and much lower at higher fields; an ease of approach of the sensor to the sample; an operation temperature of 300 mK for an aluminum sensor and 1.5 K-4 K for a niobium sensor. The different tips' characteristics may be summarized in FIG. 14.

It should be noted that in some embodiments, there is provided a scanning probe microscope configured for direct nanoscale magnetic field imaging which includes the sensor device of the present invention.

Figure 15:
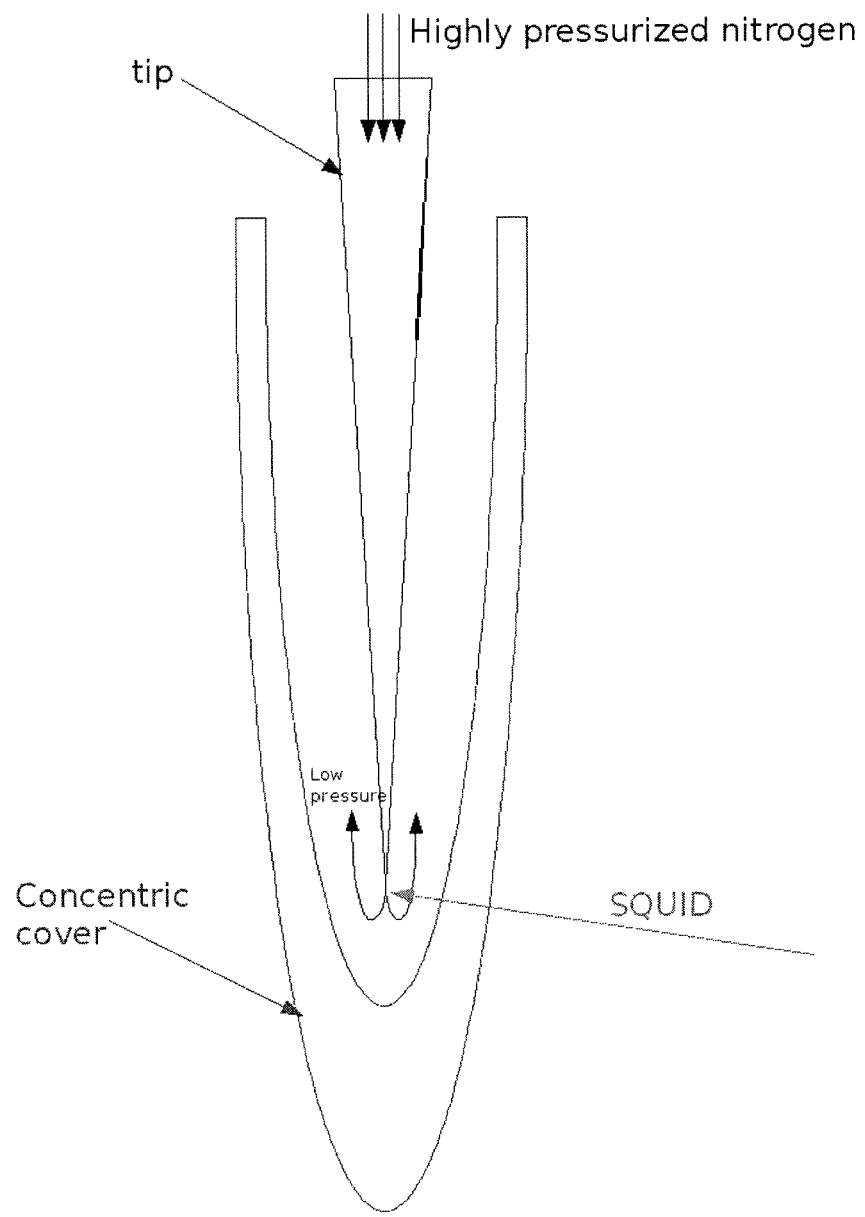

Reference is made to FIG. 15, illustrating a mechanism to cool the end of the tip using Joule-Thomson refrigeration. A tip cover 150 is configured to collect the low-pressure gas coming out of the end of the tip. The low-pressure gas may be for example, nitrogen. Using this technique and nitrogen as a low-pressure gas, the end of the tip may be cooled to a temperature of about 70 K. In this specific example, the SQUID, (and possibly the entire tube), may be made from a high-temperature superconductor, having a critical temperature higher than 70K. It should be noted that although highly pressurized gas is introduced at one extremity of the tip, the gas is low pressurized when it reaches the end of the tip. This technique enables the use of the device outside a liquid-helium/nitrogen vacuum flask (Dewar). The device may be especially adapted for measurement of living tissues for biological applications.

Those skilled in the art will readily appreciate that various modifications and changes can be applied to the embodiments of the invention as hereinbefore exemplified without departing from its scope defined in and by the appended claims.

The invention claimed is:

1. A sensor device comprising a probe carrying a magnetic field sensor, the probe having a conical tip portion made of an electrically insulating material with an edge being configured as said magnetic field sensor by which the probe when in operation directly approaches a surface of a sample, said sensor at the edge of the tip comprising at least one junction formed by superconducting layers separated by a barrier in which a superconducting current flows between the superconducting layers crossing the barrier, wherein the sensor device measures said superconducting current to enable calculation of a magnetic flux thereby enabling direct magnetic imaging of the sample.

2. The device according to claim 1, wherein said sensor is configured as a Josephson junction based sensor.

3. The device according to claim 1, wherein said conical tip portion has a maximal outer diameter not exceeding a few hundreds of nanometers.

4. The device according to claim 1, wherein said barrier comprises at least one weak link, and said superconducting layer coating on a selected circumferential region of said insulator core forms a geometrical-constriction weak link defining at least one Josephson junction at the edge of said tip.

5. The device according to claim 4, wherein said tunneling region has a lateral dimension of a few nanometers to several tens of nanometers.

6. The device according to claim 4, wherein said superconducting layer is continuous and selected from aluminum niobium, lead, indium, and tin.

7. The device according to claim 1, wherein said sensor has a core made from quartz material.

8. The device according to claim 1, wherein said sensor comprises a SQUID (Superconducting Quantum Interference Device) loop extending along a circumferential region of the conical tip portion such that constriction-based weak links are located at the edge of said tip.

9. The device according to claim 1, comprising a single electron transistor (SET) probe, thereby enabling simultaneous nanoscale imaging of magnetic field and electrical potentials having a sensitivity of μV.

10. The device according to claim 1, comprising a tip cover configured to collect a low-pressure gas and locally cooling the edge portion of said conical tip.

11. The device according to claim 1, wherein said barrier is made of a non-superconducting material.

12. A method of fabricating a Josephson junction based sensor device, the method comprising: providing a conically shaped tip-like substrate made of an electrically insulating material, and coating at least a selected circumferential region of said insulator substrate with a superconducting layer so as to form at least one weak link defining at least one Josephson junction at the edge of said tip.

13. A method of fabricating a magnetic field sensor device, the method comprising: providing a conically shaped tip-like substrate configured as a probe made of an electrically insulating material, coating at least a selected circumferential region of said insulator substrate with a superconducting layer so as to define two layer portions spaced-apart from one another at the edge of said tip; and providing an insulator spacer between said two layer portions thereby defining at least one junction formed by superconducting and non-superconducting layers at the edge of the tip-like substrate; said junction being configured as a magnetic field sensor thereby providing a probe carrying the magnetic field sensor, such that when in operation the probe directly approaches a surface of a sample.

14. The method according to claim 13, wherein coating at least a selected circumferential region of said insulator substrate comprises oxidation of said selected region.

15. The method according to claim 13, wherein said superconducting layer is selected from aluminum niobium, lead, indium, and tin.

16. The method according to claim 13, comprising evaporating said superconducting layer at least at two angles of evaporation.

17. The method according to claim 16, comprising evaporating two layers on two opposite sides of a pulled quartz tube.

18. The method according to claim 13, comprising pulling a tube to define two constriction-based weak links at the edge of said tube thereby forming two Josephson junctions defining a circular SQUID loop.

19. The method according to claim 13, coating the circumference of the insulating conical tip by a metallic or a superconducting layer patterned to define two tunneling regions to provide a single electron transistor (SET) probe on said tip; coating said tip using an insulating layer; and forming a magnetic sensor device above said insulating film.

20. The method according to claim 13, comprising coating said superconducting layer using Au or Pd—Au to protect said tip and to provide a STM tip detecting tunneling current between the end of said tip and a sample.

* * * * *